(12) United States Patent
Ono et al.

(10) Patent No.: US 6,909,180 B2
(45) Date of Patent: Jun. 21, 2005

(54) SEMICONDUCTOR DEVICE, MOUNTING CIRCUIT BOARD, METHOD OF PRODUCING THE SAME, AND METHOD OF PRODUCING MOUNTING STRUCTURE USING THE SAME

(75) Inventors: Masahiro Ono, Sakai (JP); Tsukasa Shiraishi, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 149 days.

(21) Appl. No.: 10/030,739
(22) PCT Filed: May 11, 2001
(86) PCT No.: PCT/JP01/03922

§ 371 (c)(1),
(2), (4) Date: Jan. 11, 2002

(87) PCT Pub. No.: WO01/86716

PCT Pub. Date: Nov. 15, 2001

(65) Prior Publication Data

US 2003/0049425 A1 Mar. 13, 2003

(30) Foreign Application Priority Data

May 12, 2000 (JP) ........................................ 2000-140072

(51) Int. Cl.⁷ ............................................ H01L 23/495
(52) U.S. Cl. ....................... 257/734; 257/735; 257/736; 257/737
(58) Field of Search ................................. 257/734–747

(56) References Cited

U.S. PATENT DOCUMENTS 5,461,197 A  10/1995  Hiruta et al.
5,622,590 A * 4/1997  Kunitomo et al. .......... 156/291
5,641,996 A * 6/1997  Omoya et al. ............... 257/787
5,844,320 A * 12/1998  Ono et al. .................... 257/778
6,137,184 A * 10/2000  Ikegami ....................... 257/785
6,137,185 A * 10/2000  Ishino et al. ................. 257/786
6,214,446 B1  4/2001  Funada et al.
6,261,941 B1 * 7/2001  Li et al. ....................... 438/618
6,452,280 B1 * 9/2002  Shiraishi et al. ............. 257/778

FOREIGN PATENT DOCUMENTS

| JP | 4-260358 | 9/1992 |
| JP | 8-37206 | 2/1996 |
| JP | 8-120228 | 5/1996 |
| JP | 9-27516 | 1/1997 |
| JP | 10-199932 | 7/1998 |
| JP | 11-251368 | 9/1999 |

* cited by examiner

*Primary Examiner*—Long Pham
*Assistant Examiner*—Nathan W. Ha
(74) *Attorney, Agent, or Firm*—Wenderoth, Lind, & Ponack, L.L.P.

(57) ABSTRACT

The invention is intended for providing a semiconductor package structure which prevents degradation in characteristics of a semiconductor device, and breakage of interconnections, when the semiconductor device is packaged on a circuit substrate. In the package structure having the semiconductor device mounted on the circuit substrate, bump electrodes of the semiconductor device are placed on input/output terminal electrodes of the circuit substrate and are electrically and mechanically connected thereto by bonding with a conductive adhesive, and the semiconductor device is bonded and fixed to the circuit substrate by a resin film formed previously on a surface of a main body of the circuit substrate. The structure does no damage to a semiconductor functional part and to interconnections, and allows mounting with a lower load as compared to structures using conventional anisotropic conductive films and the like.

16 Claims, 16 Drawing Sheets

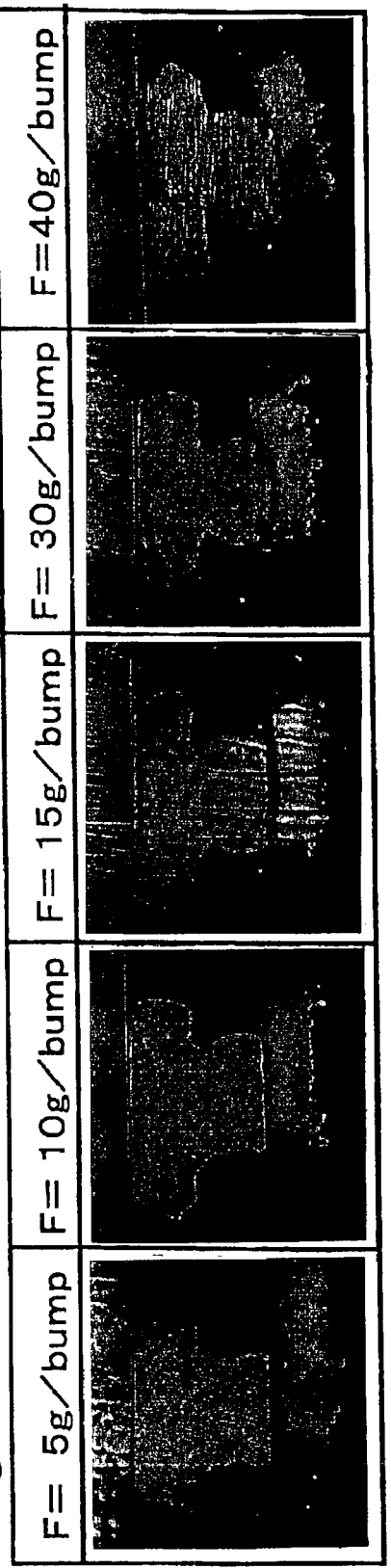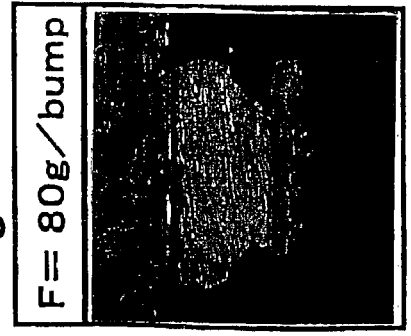

Mounting load of 20g / bump

SEMICONDUCTOR DEVICE, MOUNTING CIRCUIT BOARD, METHOD OF PRODUCING THE SAME, AND METHOD OF PRODUCING MOUNTING STRUCTURE USING THE SAME

TECHNICAL FIELD

The present invention relates to a circuit substrate to have mounted thereon a semiconductor device and a method of producing the same. The invention also relates to a method of mounting a semiconductor device, with use of such a circuit substrate.

BACKGROUND ART

As one of techniques for mounting semiconductor devices on a circuit substrate, a flip chip mounting method has been known. In this method, bump electrodes are formed on a surface of a semiconductor chip on the same side that a functional element thereof is formed, and the bump electrodes are connected through an adhesive layer to input/output terminal electrodes arranged on a circuit substrate. In this method, the bump electrodes are formed of gold (Au), nickel (Ni) or the like by plating, and for an adhesive layer solder, conductive organic adhesive or the like is used. As the conductive organic adhesive, an anisotropic conductive film or paste, or the like is used besides an isotropic adhesive.

Although solder paste and isotropic conductive adhesive require little load for connection in packaging, an anisotropic conductive film and an anisotropic conductive paste are required to be loaded to at least 200 g per pin during packaging processes in order to secure stability of conductivity and reliability.

FIGS. 16A and 16B show an example of a conventional flip chip mounting technique using an anisotropic conductive resin film (see Isao Tsukagoshi et al; "Electronics Jisso Gijutsu", 1997 March, p. 46–49, Gijutsu Chosakai Co., Ltd.). In this method, terminal electrodes of a semiconductor substrate are bonded to terminal electrodes of a circuit substrate by virtue of an anisotropic conductive resin film. The anisotropic conductive resin film contains epoxy resin conductive particles, such as Ni metal particles or Au-coated resin particles, as main ingredients of an adhesive. During assembly, the circuit substrate and the semiconductor device are heated under a load and the conductive resin film is interposed and pressed between the electrodes, so that the conductive particles in the resin film are brought into contact with one another to achieve electrical connections between all the electrodes facing each other.

Japanese Patent Publication 8-037206 discloses a method of semiconductor device packaging in which, as shown in FIGS. 17A to 17D, a conductive adhesive sheet 91 being in B-stage is interposed between dies 92, 92 and punched by a punch 93 (FIG. 17A) into small pieces 94 of the conductive adhesive sheet, each which is aligned with and bonded to a corresponding pad electrode 2 on a circuit substrate 1 so as to be used as an adhesive layer (FIG. 17B). On the other hand, ball bumps 73 are formed on electrode pads 61 of a semiconductor chip 5 (FIG. 17C). During mounting, the ball bumps 73 on the semiconductor chip 5 are heated and bonded to corresponding small pieces 94 of the conductive adhesive sheet on the circuit substrate 1 so that each of the ball bumps is connected to a corresponding electrode (FIG. 17D).

Japanese Patent Publication 10-199932 discloses a method for packaging a semiconductor device in which electrically conductive and plastically deformable bumps are formed on a large number of pad electrodes on a semiconductor chip, are leveled in a height direction, and are pressed against and bonded to corresponding pads on a circuit substrate. To bond, adhesive is applied to flat head planes of the leveled bumps which are joined to the corresponding pads.

In recent years, semiconductor devices have increasingly been required to be very compact, and to be capable of performance for use in portable electronic equipment. In order to fulfill these requirements, it is important that semiconductor devices to be mounted on, and interconnected with, circuit substrates should be provided with an increased number of pins for input/output terminals with a much smaller pitch between adjacent terminals, and that an area array of electrodes can be achieved in a zone where the electrodes can be arranged. This requires further development of techniques for achieving narrower-pitch connection.

An area array arrangement of electrodes has been established by conventional solder bump methods. A solder bump technique has advantages in that stresses acting on active elements on an integrated circuit chip during mounting are relatively small, thereby allowing the integrated circuit chip to sustain no damage. However, a diameter of solder bumps is so large that an electrode arrangement for mounting with area array arrangement has been limited to an electrode pitch of about 250 $\mu$m, if necessity of miniaturizing processes of substrates and package reliability are considered.

The above heat-press bonding technique using an anisotropic conductive adhesive has been noted from the viewpoint of production efficiency improvement for cost reduction, because productivity of a packaging process is expected to be higher than ever.

In the above heat-press bonding method using an anisotropic conductive resin film, by pressing the conductive resin film between each of bump electrodes on a semiconductor substrate and corresponding input/output terminal electrodes on a circuit substrate, conductive particles are brought into contact with one another to impart electrical conductivity between the bump electrodes on the semiconductor substrate and corresponding input/output terminal electrodes of the circuit substrate. For providing connection between the electrodes, a considerably large load between the electrodes during mounting is required to be, for example, not less than 200 g per bump electrode. This force may damage a semiconductor circuit or may cause failures, or breakage, of Al interconnections on the semiconductor substrate.

In packaging by using this method, the conductive resin in its entirety is cured while the semiconductor substrate is being pressed with a large force so as to be brought into direct contact with the input/output terminal electrodes of the substrate, so that stress occurring between electrodes facing each other produces residual stress within the semiconductor substrate, thereby reducing performance of a semiconductor circuit. In particular, pressure exerted on the bump electrodes at a time of mounting may cause the input/output terminal electrodes of the circuit substrate to be deformed into fracture during via hole filling of the substrate connected to the electrodes, resulting in faulty connections in the circuit substrate.

This may happen because, in a case of an anisotropic conductive resin, conductive particles contained in the anisotropic conductive resin and silica filled therein for controlling a thermal expansion coefficient can stress a surface on a side of a semiconductor functional part of the semiconductor substrate due to pressure during packaging.

In the packaging technique disclosed in Japanese Patent Publication No. 8-037206, there has been a problem in that bonding of a large number of ball bumps to adhesive layers reduces reliability because small pieces of a conductive sheet punched from a conductive adhesive sheet must be handled. While loads during packaging are partially applied only to the vicinity of the electrodes, thereby reducing damage to a semiconductor device, an increase in pressure for ensuring bonding may cause a risk with regard to destructing via holes beneath pad electrodes on a circuit substrate because bump electrodes apply pressure to the pad electrodes and stress the pad electrodes. Another problem is that the conductive adhesive sheet is very weak in terms of adhesive strength for joining the semiconductor device to the circuit substrate, thereby resulting in reducing reliability of a semiconductor package.

In the above method of Japanese Patent Publication No. 10-199932, adhesive is applied to tops of bumps on a semiconductor chip and then the bumps are joined to surfaces of pads, resulting in unevenness in height of the bumps which causes faulty bonding; therefore, in order to improve reliability of adhesion between all opposing electrodes, the bumps are required to be previously leveled in height. Though the bumps might be deformed so as to collapse and bonding could be thereby reinforced, there is a danger that such a deformation might result in damage to the semiconductor chip as described above.

SUMMARY OF THE INVENTION

It is an object of the present invention to provide a circuit substrate, which is to constitute a package structure by mounting a semiconductor device thereon, which allows connections between electrodes without exerting stress to electrodes or degrading characteristics of the semiconductor device while being mounted onto the circuit substrate.

It is another object of the invention to provide a method for allowing connections between electrodes without development of residual stress between these electrodes when mounting a semiconductor device onto a circuit substrate, and a method of producing such a package structure.

The circuit substrate of the invention includes conductive resin adhesive layers (portions) which are bonded to input/output electrodes, respectively, on a surface of the circuit substrate, and a resin film that has previously covered the surface of the substrate including the conductive resin adhesive layers. Bump electrodes corresponding to these input/output electrodes, having pointed heads, are formed on electrodes of a semiconductor device.

When the semiconductor device is mounted onto the circuit substrate, the bump electrodes of the semiconductor device are pressed toward the input/output electrodes on the circuit substrate such that the pointed heads of the bump electrodes pierce the resin film on the circuit substrate and reach respective conductive adhesive layers. The conductive adhesive layers receive the bump electrodes, attach fixedly thereto, and relax stresses to be applied to the semiconductor device by the bump electrodes, which avoids damaging semiconductor circuits and interconnections on the semiconductor device. Even if the heads of some of the bump electrodes do not reach the input/output electrodes because of warp in the circuit substrate or unevenness in height of the pointed heads, the pointed heads are received within the conductive adhesive layers so that electrical connection between opposing electrodes can be secured by conductivity of the conductive adhesive layers.

In the present invention, the resin film serves also as a protective coating which protects the input/output electrodes of the circuit substrate. For a package structure, the resin film has a function of supporting and reinforcing connection regions, including the bump electrodes and the conductive adhesive layers, to integrally join a surface of the circuit substrate to a surface of a semiconductor circuit, thus ensuring electrical and mechanical reliability of the package structure and enabling heat-press packaging that is suitable for high productivity.

The package structure of the present invention is capable of preventing degradation in characteristics of a semiconductor functional part, and failures such as breaks in interconnections that have been problems with conventional anisotropic conductive films, because the conductive adhesive layers relax stress during packaging. Besides, use of conductive adhesive layers allows mounting with a low load, because such a mounting load that deforms the input/output electrodes of the circuit substrate is not required. Moreover, addition of conductive adhesive layers having a flexible nature into a junction layer leads to provision of a package structure that is more reliable than conventional structures. The package structure can be assembled with heat-press bonding mounting with high productivity and low cost that causes no damage, in contrast to typical package structures for an integrated circuit.

BRIEF DESCRIPTION OF THE DRAWINGS

FIGS. 13A to 13E are metallographical photographs, each showing a metal section of a connection part between a bump electrode and a conductive adhesive layer in an embodiment in which a glass epoxy substrate was used as a circuit substrate, and in which connection was made with a mounting load varied as a parameter;

FIG. 13F shows a photomicrograph of a metal section of a connection part between a bump electrode and a conductive adhesive layer in an embodiment in which a glass ceramic substrate was used as a circuit substrate;

DETAILED DESCRIPTION OF THE PREFERRED EMBODIMENTS

Figure 1A:
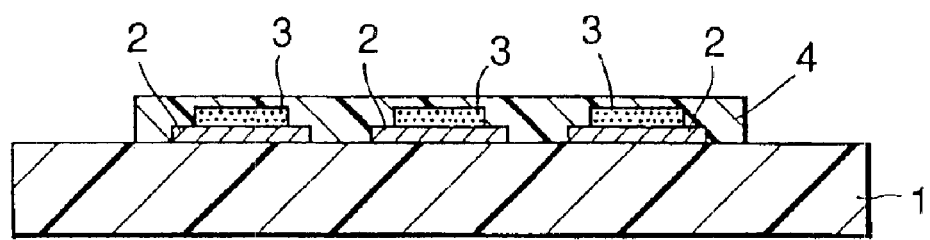
FIG. 1A shows a schematic cross-sectional view of a circuit substrate according to an embodiment of the invention.

A circuit substrate of the present invention is a circuit substrate to have mounted thereon a semiconductor device. The circuit substrate comprises input/output terminal electrodes formed on a surface of a main body of the substrate, conductive adhesive layers (portions) attached to the terminal electrodes, and a resin film formed on the surface of the main body of the substrate so as to cover the terminal electrodes and the conductive adhesive layers.

Such a circuit substrate may be produced as follows. Conductive adhesive is applied by printing the adhesive onto input/output terminal electrodes formed on a surface of a main body of the substrate, and the conductive adhesive layers are thereby formed. After the conductive adhesive layers are cured, the surface of the main body of the substrate is coated with a resin film so that the film covers the conductive adhesive layers together with the terminal electrodes.

The circuit substrate of the invention is used such that a semiconductor device may be mounted on the circuit substrate for producing a package structure of the semiconductor device. In the package structure, bump electrodes on the semiconductor device are electrically connected through the conductive adhesive to the input/output terminal electrodes on the main body of the circuit substrate, and the semiconductor device is bonded and fixed to the circuit substrate by the resin film which has previously been formed on the main body of the circuit substrate.

At a time such a package structure is assembled, the bump electrodes have pointed heads that have previously been formed on input/output electrodes of the semiconductor device, and the circuit substrate is provided with its input/output terminal electrodes on the surface of the main body of the circuit substrate. The conductive adhesive layers are formed on these terminal electrodes, and also formed is the resin film covering the surface of the main body of the substrate and the conductive adhesive layers. The package structure is assembled and produced as follows. The semiconductor device is pressed to the circuit substrate so as to insert the bump electrodes into the resin film, after the film has been melted on the circuit substrate through heating, such that the bump electrodes become fixed to respective conductive adhesive layers. Then, the bump electrodes are electrically connected to corresponding terminal electrodes of the circuit substrate before the resin film is cured so as to join the semiconductor device to the circuit substrate.

In the present invention, at a time of packaging, the conductive adhesive layers, which comprise composite material containing conductive particles dispersed in high density in a resin component, have already been heated, thereby remaining softened. When fitted onto the terminal electrodes on the main body of the circuit substrate, the bump electrodes having the pointed heads on the semiconductor device have only to reach the softened conductive adhesive layers, but do not require so high a pressure as to deform the electrodes of the circuit substrate, i.e., the semiconductor device can be joined to the circuit substrate even with a low mounting load. The conductive adhesive layers of the circuit substrate receive the bump electrodes, and deform to lessen stress which is to be developed by such reception, and therefore prevents residual stress from remaining in the semiconductor device. As a result, degradation in characteristics of the semiconductor device, breaks in interconnection, and the like can be effectively prevented.

Moreover, the circuit substrate may originally be provided with the conductive adhesive layers on the electrodes on the surface of the main body of the circuit substrate, and with the resin film (film) which fully covers the surface of the main body of the substrate together with the conductive adhesive layers so that the semiconductor device can be packaged by performing one procedure of heat-press bonding, thus achieving a packaging operation at a low cost.

The conductive adhesive may be prepared by kneading a pasty mixture of a resin component and conductive particles as conductive filler. When used, the adhesive is coated, in a thin layer, onto a top surface of each of the input/output terminal electrodes (i.e., pad electrodes) on the main body of the circuit substrate to form the conductive adhesive layers.

The resin component of the conductive adhesive may be selected from thermoplastic resins and thermosetting resins, and epoxy resin may preferably be used in view of stability and electric insulation, especially high-frequency performance and strength, and high heat resistance. The resin component is solid at ordinary temperatures, and preferably, may be suitably softened or melted when being moderately heated during a mounting operation.

As the conductive particles, there can be used particles formed of a metal selected from noble metals of Cu, Ag, and Au, an iron group of Fe, Ni and Co, a platinum group of Pt, Pd, et al, and other metals such as Zn, and carbon C. Resin particles coated with metal, such as Au-coated resin particles, also can be used.

On the other hand, the resin film is made of a resin selected from among thermosetting resins which, during a mounting operation, can be softened or melted under moderate heat applied to the circuit substrate in its entirety. As such a resin, for example, thermosetting epoxy resin, silicone resin, urethane resin, polyvinyl chloride resin, phenolic resin, acrylic resin, polyester, polycarbonate, and polyacetal can be used, and particularly, epoxy resin may be preferable.

The resin film may further contain a powdery filler that is suitable for viscosity control, an expander or reinforcement. As the filler, for example, there can be used inorganic particles such as silica $SiO_2$, alumina $Al_2O_3$, silicon nitride $Si_3N_4$, silicon carbide SiC, and aluminum nitride AlN. In this case, the resin film exhibits insulation.

It is preferable for such conductive adhesive layers, on the electrodes, to have a thickness of not greater than 10 $\mu$m, and it is particularly preferable for the layers to have a thickness on the order of 0.1 to 3 $\mu$m.

The resin film may contain conductive particles as the filler, with these conductive particles being used, for example, for an anisotropic conductive resin film containing suitable metal particles. In this case, the resin film has only to be insulating under no load or pressure during mounting, even when the resin film is sandwiched between electrodes. Electrical connections between the electrodes is provided by the conductive adhesive layers that are separately provided on the electrodes of the circuit substrate.

Figure 1B:
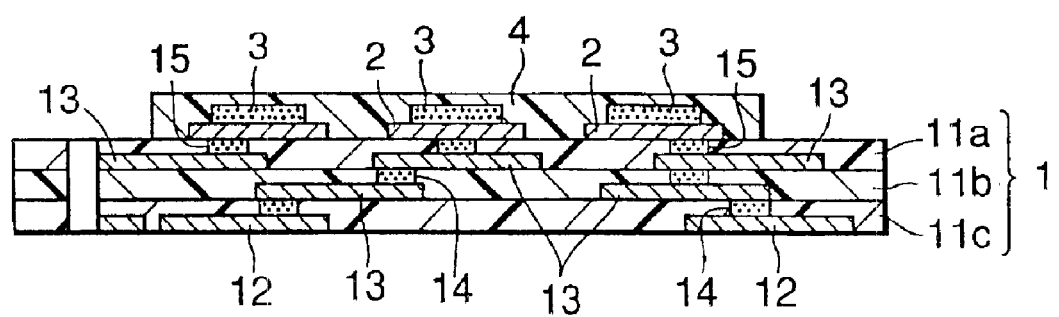
FIG. 1B shows a schematic cross-sectional view of a multilayered circuit substrate according to an embodiment of the invention.

FIGS. 1A and 1B show schematically a cross-sectional view of a circuit substrate. Input/output terminal electrodes 2 are formed on a surface of a main body 1 of the circuit substrate, and, in this example, the terminal electrodes 2 have flat top surfaces on which conductive adhesive layers (portions) 3 are formed. A resin film 4 is attached and adheres to an entire surface of the main body 1 of the circuit substrate, in this example, so as to cover the conductive adhesive layers 3 and the input/output terminal electrodes 2 (pad electrodes). FIG. 1A shows an example of a single-layer resin substrate and FIG. 1B shows an example of application to a multilayered resin substrate. In the substrate of this example in FIG. 1B, there are arranged three resin insulating layers 11a, 11b, and 11c, and interlayer electrodes 13 having specified patterns interposed between the insulating layers. Upper and lower interlayer electrodes are connected by conductors, i.e., via conductors 14, formed through the insulating layers 11a, 11b, and 11c. Via conductors 15 on a top surface are connected to the pad electrodes 2 on the surface, and electrodes 12 for interconnection are provided on a lower surface of the resin insulating layer 11c, i.e., a lowermost layer.

Figure 2A:
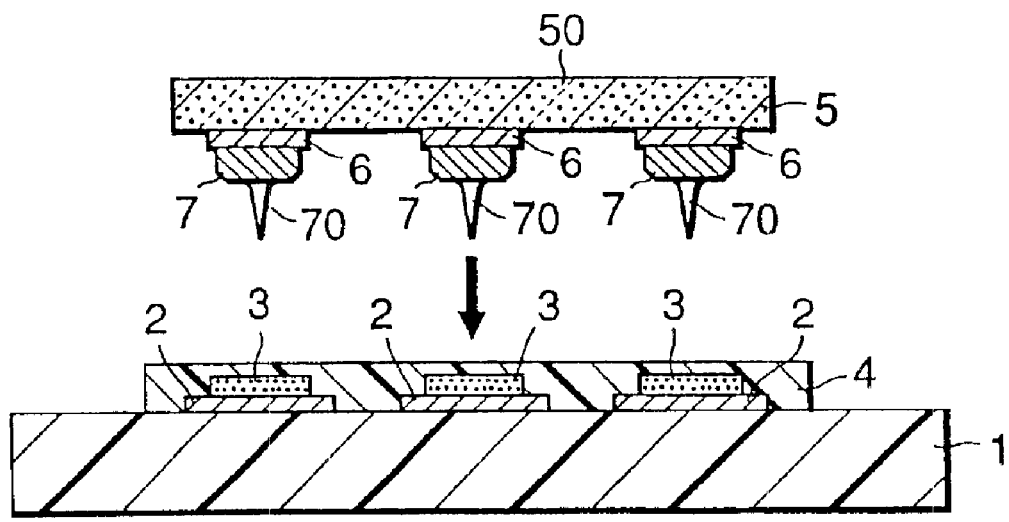
FIG. 2A shows an arrangement of a circuit substrate and a semiconductor device during a production process according to an embodiment of the invention.
Figure 2B:
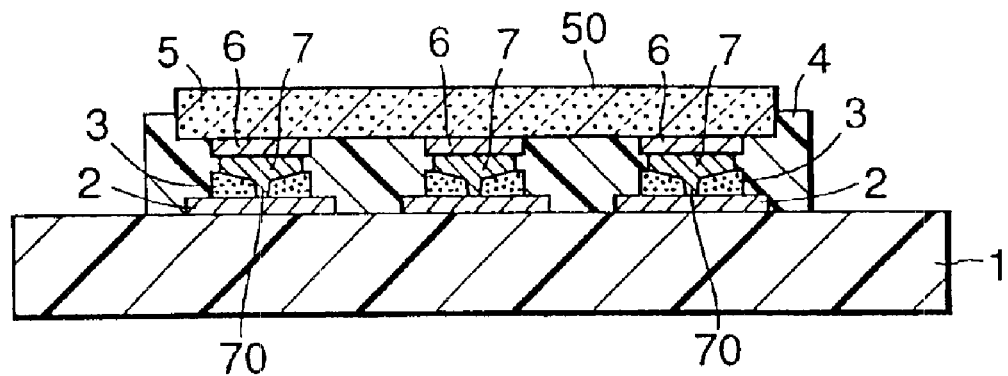
FIG. 2B shows a package structure for the semiconductor device in a state where the circuit substrate and the semiconductor device shown in FIG. 2A have been assembled.

FIG. 2A shows a process of packaging a semiconductor device 5 on the circuit substrate, and FIG. 2B shows a package structure in which the semiconductor device 5 has been joined to the circuit substrate.

In the semiconductor device 5 of this example in FIG. 2A, a semiconductor functional part ((not shown) e.g., an integrated circuit portion) and a large number of input/output terminal electrodes 6 (pad electrodes) connected to the semiconductor functional part are formed on a surface of a semiconductor substrate 50, and projection electrodes 7 (bump electrodes) having pointed heads are formed on these terminal electrodes.

As described above, the circuit substrate to receive the semiconductor device 5 is originally formed with conductive resin adhesive layers 3 positioned on the input/output terminal electrodes 2 on the surface of the main body 1 of the circuit substrate corresponding to the bump electrodes 7 of the semiconductor device 5, and with a resin film 4 which covers the main body 1 of the circuit substrate.

During a mounting operation, the semiconductor device is sucked by a heated head of a mounting machine, that is provided with a heater, and is heated and pressed to the circuit substrate so that the bump electrodes 7 are inserted into corresponding conductive adhesive layers 3 of the substrate, and later, the semiconductor device is cooled. The bump electrodes 7 are thereby bonded to the conductive adhesive layers 3, and the semiconductor substrate 50 of the semiconductor device is bonded and fixed to the circuit substrate by the resin film 4. In this process, the circuit substrate also may be heated such that the conductive adhesive 3 and the resin film 4 are softened.

FIG. 2B shows the package structure in which the semiconductor device 5 has been mounted on the circuit substrate. In this structure, the conductive adhesive layers 3 of the circuit substrate receives the bump electrodes 7 of the semiconductor device 5, and bonds and fixes the bump electrodes 7 via a bonding effect of the adhesive layers. Further, the resin film 4 having covered the surface of the main body of the substrate now fills a gap between the circuit substrate and the semiconductor device 5, which bonds the circuit substrate to the semiconductor device 5 and stably fixes the circuit substrate relative to the semiconductor device.

This circuit substrate as described above, configured by formation of the adhesive layers on the input/output terminal electrodes 2 of the substrate, and by coating of the resin film 4 thereon, may be formed as follows. The input/output terminal electrodes 2 (pad electrodes) have previously been formed on the surface of the main body of the circuit substrate so as to correspond accurately to the input/output terminal electrodes 6 of the semiconductor device 5 and, during a process of forming the conductive adhesive layers 3, conductive adhesive is preferably applied by a printing process onto the input/output terminal electrodes 2 formed on the surface of the main body of the substrate. Alternatively, conductive adhesive transferred onto the bump electrodes 7 of the semiconductor device may be transferred again onto the input/output terminal electrodes of the circuit substrate.

Figure 3A:
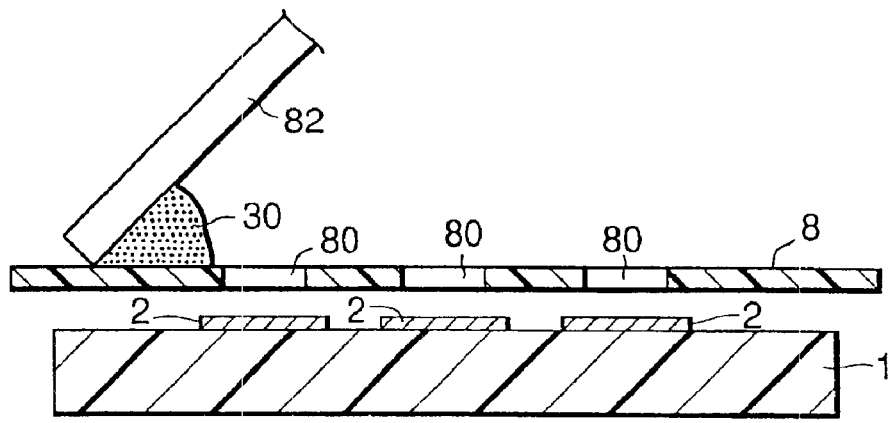
FIGS. 3A to 3D show processes of producing a circuit substrate according to an embodiment of the invention, in schematic cross sectional views.
Figure 3B:
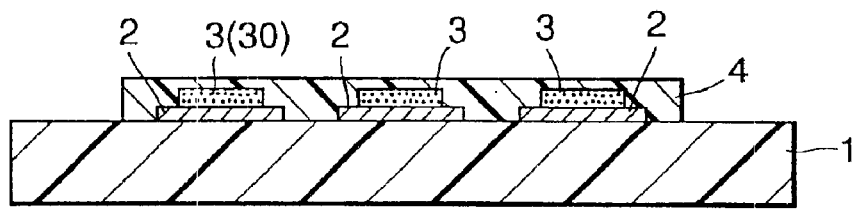

For the printing process of forming the adhesive layers, FIGS. 3A and 3B show an example using screen printing. The printing process includes preparation of paste 30 of a conductive adhesive from a liquid resin component and conductive particles (e.g., silver particles), and a required viscosity modifier or the like. As shown in FIG. 3A, a screen mask 8 is positioned with respect to the terminal electrodes 2 of the circuit substrate so as to mask portions of the main body of the substrate but not the terminal electrodes 2, and the paste 30 is developed on the screen mask 8 by a squeegee 82 so as to be applied only onto the terminal electrodes 2 in a required thickness. The conductive adhesive layers 3 are thereby applied onto the terminal electrodes 2 as shown in FIG. 3B, and are subsequently cured. If a solvent-type adhesive is used as a conductive adhesive, the adhesive can be cured by volatilizing the solvent therein.

Figure 3C:
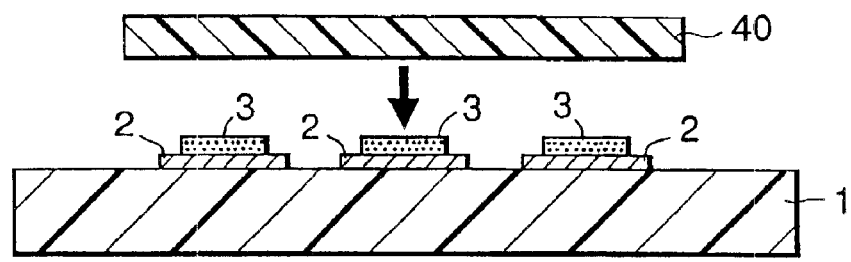
Figure 3D:
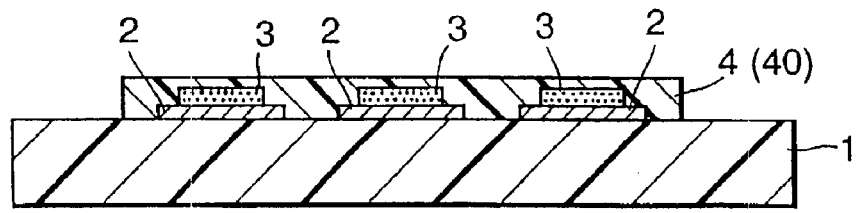

In a subsequent resin film coating process, a thermosetting resin film 40 may be used, which has previously been formed, for the resin film and which has an appropriate adhesive property, in which case, as shown in FIG. 3C, the resin film 40 is heated to be softened and is bonded onto the surface of the main body of the substrate so as to cover both the conductive adhesive layers and the terminal electrodes 2. The resin film 40 is heated such that a surface of the resin film 40 sticks to the surface of the main body of the substrate for bonding. As a result of this process, as shown in FIG. 3D, the circuit substrate can be obtained on which the conductive adhesive layers and the resin film 4 are stacked.

For bump electrode 7 of the semiconductor device a structure can be used which has a projecting portion 70 at an extremity thereof, and is capable of piercing the resin film 4 and conductive adhesive layer 3. For example, there can be used projected conductive electrodes made with use of a wire bonding method, or projected electrodes formed with use of an electroplating or electroless plating method. In particular, projected electrodes shaped by plucking away molten metal using a wire bonding method may be used as the bump electrodes 7, and, during a mounting operation, a pointed head of each of the bump electrodes can produce an increased force to pierce into the resin film 4 at a time of mounting, thereby providing stable connections between the electrodes 2 and 7 by pressing with a low load. For such bump electrodes, for example, a low-melting metal or alloy thereof, containing Au, Sn, Ag, Pb, Bi, Zn, Sb, Pd, C, Pt, or the like may be used. The pointed heads of the bump electrodes preferably may have a rectangular, circular, or elliptical shape, with a size of one side or a diameter of an extremity thereof being not greater than about 20 $\mu$m. It is particularly preferable for the size of each pointed head to be not greater than 10 $\mu$m.

Another method of producing the circuit substrate may include steps of: previously forming conductive adhesive layers 3 on separate resin film 40 as described above to prepare resin film 4; covering the main body of the circuit substrate with the resin film 40 such that the conductive adhesive layers face input/output terminal electrodes 2 of circuit substrate 1; and bonding the resin film to the main body of the circuit substrate. In order to form the conductive adhesive layers 3 on the resin film 40, there can be used a method of applying conductive adhesive paste 30 onto a thermoplastic resin film by performing a printing process with a pattern corresponding to an arrangement of the terminal electrodes 2 on the main body of the circuit substrate.

Figure 4A:
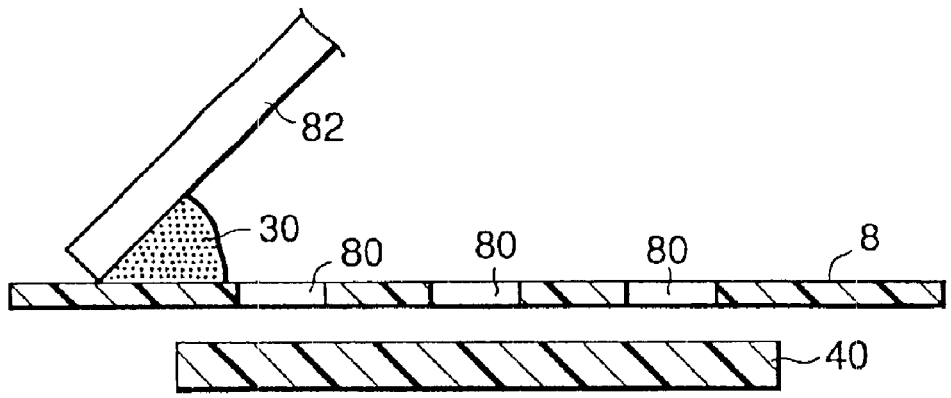
FIGS. 4A to 4D show processes of producing a circuit substrate according to another embodiment of the invention, in schematic cross-sectional views.
Figure 4B:
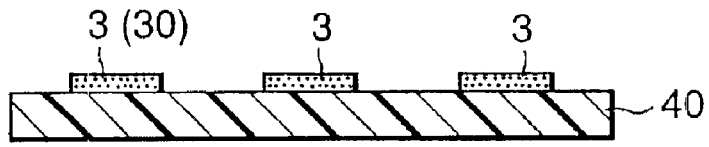

In FIG. 4A, a separate resin film 40 is coated with conductive adhesive paste 30 in a specified thickness, by printing with use of printing screen mask 8 and squeegee 82. The conductive adhesive paste applied may preferably be cured. Patterned conductive adhesive layers 3 are thereby formed on the resin film 40 as shown in FIG. 4B.

Figure 4C:
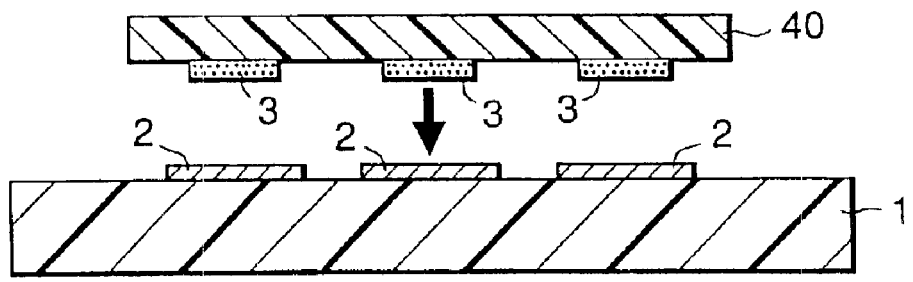
Figure 4D:
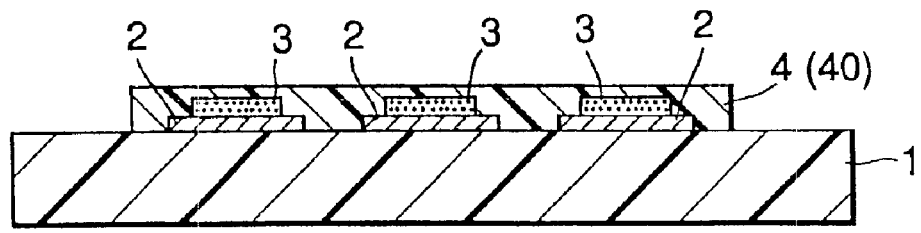

As shown in FIG. 4C, the resin film 40 having conductive adhesive layers 3 thereon is bonded onto the main body 1 of the circuit substrate such that the conductive adhesive layers 3 accurately oppose respective input/output terminal electrodes 2 on the main body of the circuit substrate and cover the terminal electrodes 2. For bonding, the resin film 40 is heated to such an extent that a surface of the resin film adheres to the main body 1 of the circuit substrate. Thus, this process, as shown in FIG. 4D, can provide a circuit substrate with which the conductive adhesive layers 3 and the resin film 4 are integrated.

Another method of forming conductive adhesive layers 3 on resin film 40, as shown in FIGS. 5A to 5F, when preparing resin film 4, may include: initially bonding a masking sheet 81 onto a resin film 40; and boring through holes 85 of a specified pattern through the bonded masking sheet 81 to form a mask.

In this method, the through holes 85 are bored through the masking sheet 81 so as to coincide with positions on the resin film 40 that are to correspond to terminal electrodes 2 on the main body 1 of the circuit substrate. The through holes 85 end at a surface of the resin film 40 that defines bottom surfaces of the through holes, and are filled with conductive adhesive paste 30. After this filling, only the masking sheet 81 is removed. With removal of the masking sheet 81, the paste 30 that has filled the through holes 85 remains as the conductive adhesive layers 3, with a desired pattern, on the resin film 40. The masking sheet 81 is preferably composed of two layers, i.e., a separate resin sheet 84 to be bonded onto the resin film 40, and a release sheet 83 that adheres to the sheet 84. The through holes are formed so as to pierce the resin sheet 84 and the release sheet 83. The masking sheet composed of two layers has an advantage of improving formability of conductive adhesive, for the following reason. At a time of filling, some of conductive adhesive paste 30 remains on the release sheet 83 outside of the through holes, and there is a fear that the conductive adhesive paste inside the through holes might be exfoliated and removed simultaneously with removal of the resin sheet 84 if the paste that has overflowed the through holes is cured. If only the release sheet 83 can immediately be stripped off while the paste is in a soft state after filling, however, conductive adhesive can be reliably and fully fed only into the through holes and the cured resin sheet 84 has only to be stripped off afterward.

Figure 5A:
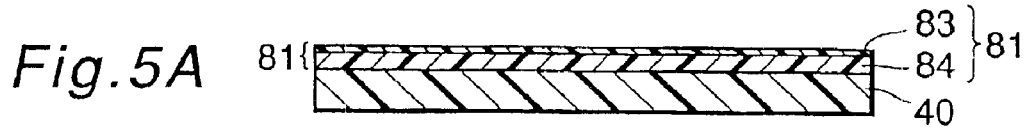
FIGS. 5A to 5H show processes of producing a circuit substrate according to still another embodiment of the invention, in schematic cross-sectional views.

In the method of producing the circuit substrate, which is shown in FIGS. 5A to 5H, in detail, the separate resin sheet 84 and the release sheet 83 stacked on the sheet 84 are initially bonded, as the masking sheet 81, onto the resin film 40, as shown in FIG. 5A. Because the resin film 40 is to be resin film 4 when the resin sheet 84 and the release sheet 83 are later removed, materials chosen for the release sheet 83 and resin sheet 84 are ones which can easily be separated from the resin film 40. For the release sheet 83, Teflon, cellophane, polyethylene terephthalate), silicone, or the like, may be used, which is non-adhesive and has a releasable property. For the resin sheet 84 may be used, for example, a resin soluble in acid or alkali, such as polyacetal, polycarbonate, epoxy resin, phenolic resin and polyester.

Figure 5B:
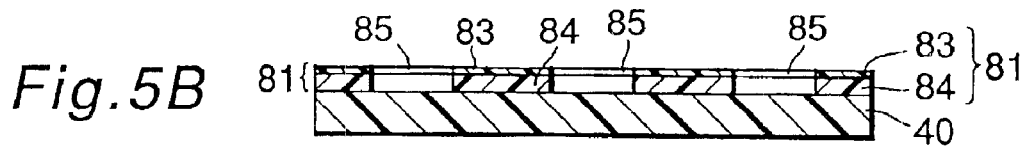

In a next step, as shown in FIG. 5B, the through holes 85 through the resin sheet 84 and the release sheet 83, both stacked on the resin film 40, are accurately positioned relatively to the corresponding terminal electrodes 2 provided on the main body 1 of the circuit substrate The resin sheet 84 and the release sheet 83 are scanned with a laser beam, and positions therein corresponding to the terminal electrodes 2 are illuminated with the laser beam so as to be heated and melted such that the through holes 85 are formed.

The through holes can be formed by ultraviolet irradiation instead of laser irradiation. In an ultraviolet irradiation method, a resin sensitive to ultraviolet rays is used. As the resin for this purpose, ultraviolet curing epoxy or acrylic resin can be preferably used. When portions of uncured release sheet 83 are masked for interception of rays of light and the sheet is irradiated with ultraviolet rays in this method, portions of the sheet other than the masked portions are cured, whereas portions to be removed directly under an intercepting mask remain uncured. Then, removal of the uncured portions results in formation of the through holes.

Figure 5C:
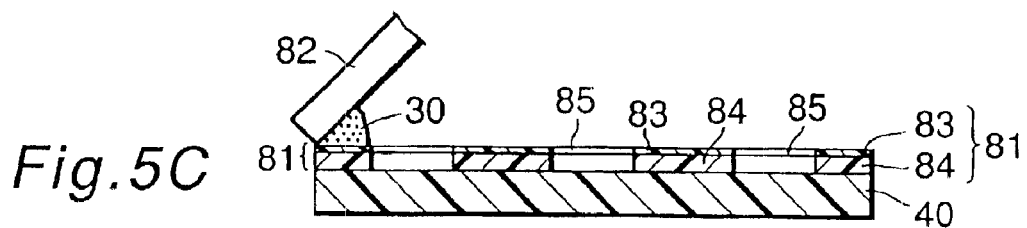
Figure 5D:
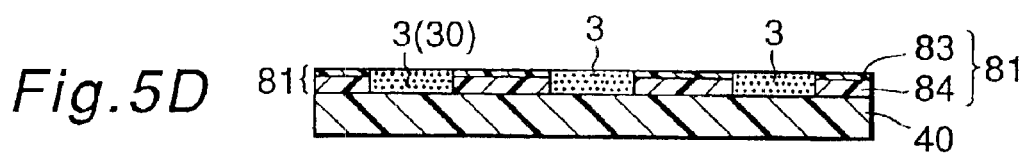
Figure 5E:
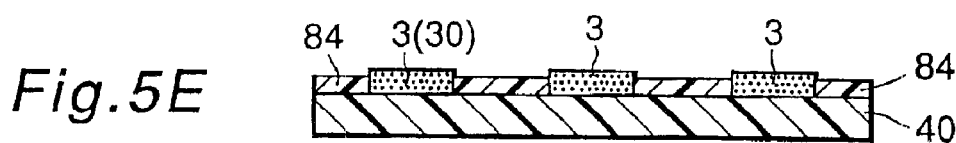
Figure 5F:
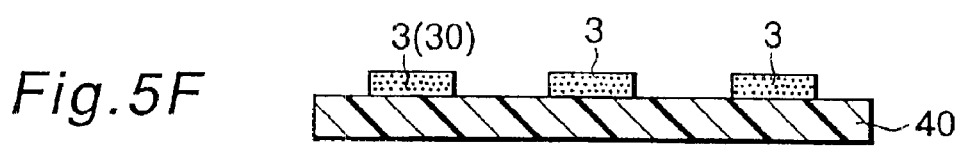

In a next step, as shown in FIGS. 5C and 5D, paste 30 of a conductive adhesive is extended onto the release sheet 83 with the squeegee 82, so that the through holes are filled with the paste. Embedded paste 30 of the conductive adhesive is then cured. If a solventtype resin is used as the conductive adhesive, the adhesive can be cured by vaporization of its solvent. After that, the release sheet 83 is pealed off as shown in FIG. 5E, and an acid-soluble resin of the resin sheet is removed, as shown in FIG. 5F, by acid treatment with hydrochloric acid, sulfuric acid or the like.

Figure 5G:
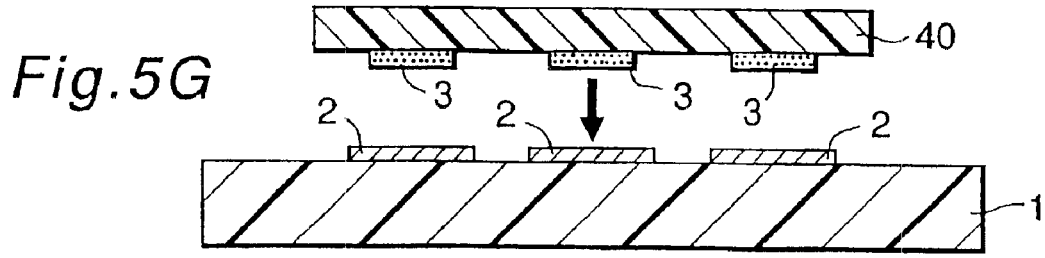
Figure 5H:
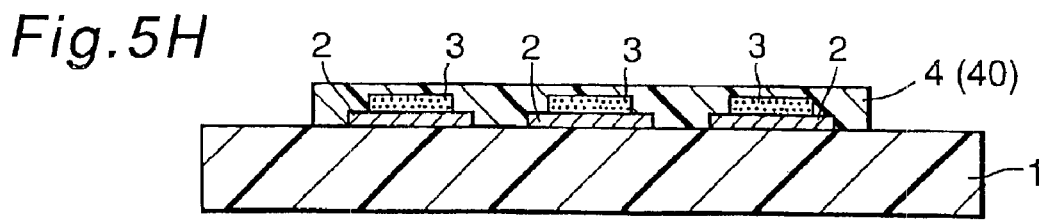

The resin film 40, thus having patterned conductive adhesive layers 3, is bonded onto a main body of a circuit substrate as shown in FIG. 5G. For bonding, a method of heating the resin film 40 to within a temperature range is employed in which the resin film is softened so as to adhere to a surface of the main body of the substrate. Thus, as shown in FIG. 5H, the circuit substrate in which the conductive adhesive is integrated with the resin film 4 can be obtained.

In a package structure using the circuit substrate of the invention in which bump electrodes of a semiconductor device are electrically and mechanically connected to input/output terminal electrodes 2 of the circuit substrate 1 through conductive adhesive, the semiconductor device is bonded by a resin film 4 formed previously on the main body 1 of the circuit substrate. An elastomer layer, which is elastically softer than the resin film 4, or a sealing resin, may be interposed between the semiconductor device and the resin film 4.

In a method of producing the package structure, semiconductor device 5 has bump electrodes 7, main body 1 of the circuit substrate has input/output terminal electrodes 2 on a surface thereof, and a separate resin film 4 is previously provided with conductive adhesive layers 3 corresponding to the terminal electrodes 2 on the main body of the circuit substrate, on one side of the film, and an elastomer layer corresponding to the semiconductor device 5 is provided on another side of the film.

In this embodiment, the circuit substrate has a main body 1 on which terminal electrodes 2 as described above are arranged, conductive adhesive layers 3 are on the terminal electrodes 2, a resin film 4 covers the conductive adhesive layers, and an elastomer layer is provided on the resin film 4. The elastomer layer on the resin film 4 may be interposed between a semiconductor functional part of the semiconductor device 5 and the resin film 4 on the main body of the circuit substrate, thus constituting a package structure.

As the elastomer layer, a layer of synthetic resin (including elastic synthetic rubber) may be used, which is softer and has a lower elasticity modulus than the resin film 4. In this arrangement, at least the semiconductor functional part of the semiconductor device 5 is protected by the elastomer layer. The elastomer layer absorbs and reduces a stress that acts through rigid resin film 4, or an exterior impulsive force, and therefore prevents damage to and degradation in function of the semiconductor functional part, e.g., an integrated circuit portion on a semiconductor substrate 50.

The elastomer layer may preferably be a silicone elastomer layer while resin film 4 is of epoxy.

Figure 6A:
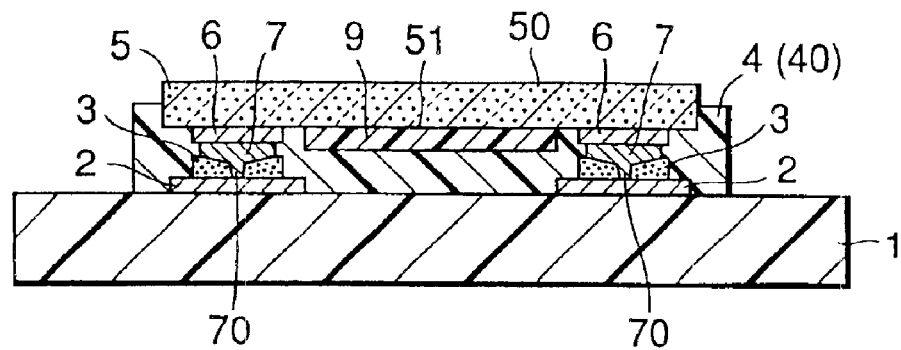
FIG. 6A shows a schematic cross-sectional view of a package structure according to an embodiment of the invention.

FIG. 6A shows an example of a package structure having elastomer layer 9, in which bump electrodes 7 formed on input/output terminal electrodes 6 (pad electrodes) of semiconductor device 5 are connected and fixed to terminal electrodes 2 of circuit substrate 1 through conductive adhesive. Peripheries of connecting portions between the electrodes 2 and 7 are reinforced by a resin film 4. The elastomer of silicone rubber and is provided between the resin film 4, which is of epoxy, and a surface of the semiconductor device 5 on which a semiconductor functional part 51 is arranged. The elastomer layer 9 isolates the resin film 4, which is rigid. This can thus reduce damage to the semiconductor functional part 51 on the semiconductor device 5. Further, the conductive adhesive can relax stresses developed when packaging, and thereby avoid deteriorating characteristics of elements and breaking interconnections.

Figure 6B:
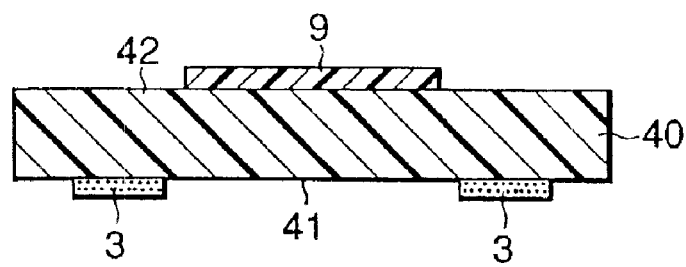
FIG. 6B shows a schematic cross-sectional view of a resin film for a circuit substrate used in the package structure of FIG. 6A.

FIG. 6B shows a resin film 40 used on a main body 1 of a circuit substrate for use in a package structure, wherein the resin film has conductive adhesive layers 3 in a specified pattern on one surface thereof, and has an elastomer layer 9 fixed to another surface thereof In this example, the elastomer positioned so as to face a semiconductor functional part 51 of semiconductor device 5 when it is incorporated into the package structure.

Figure 6C:
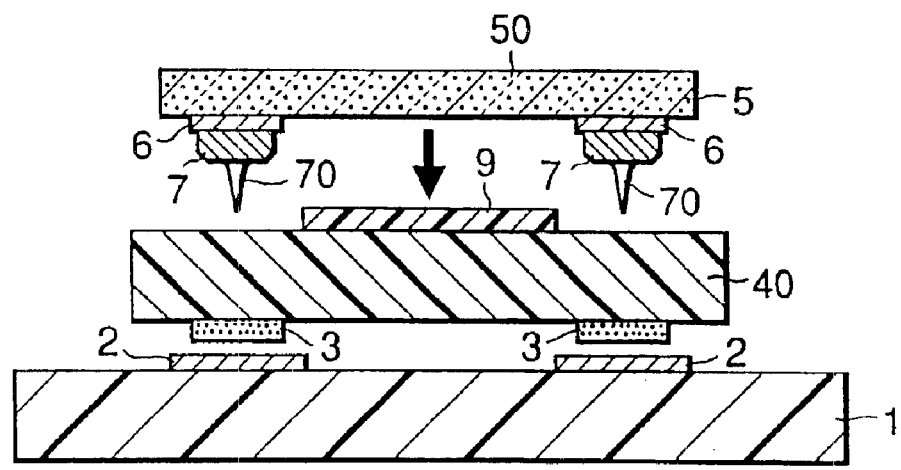
FIG. 6C shows a schematic cross-sectional view illustrating a process of assembling the package structure of FIG. 6A with use of the resin film shown in FIG. 6B.

FIGS. 6A and 6C show a process of assembling the package structure with use of the resin film 40, to which the elastomer attached, and show a resultant package structure. During assembling, the conductive adhesive layers 3 on the one surface of the resin film are made to correspond to terminal electrodes 2 on the main body 1 of the circuit substrate, and the semiconductor device 5 is placed correspondingly on another surface of the resin film 40 having the elastomer that the elastomer positioned on the semiconductor functional part 51. In a softened state of the resin film 40 during heating thereof, the semiconductor device 5 is pressed toward the circuit substrate so that bump electrodes 7 on terminal electrodes 6 (pads) pierce the resin film 40 and reach the conductive adhesive layers 3, thereby achieving electrical connections. The resin film 40 fills a space between the circuit substrate and the semiconductor device 5, thereby placing the elastomer layer 9 pad onto the semiconductor device 5, and the resin film integrally bonds the semiconductor device 5 to the circuit substrate.

Figure 7A:
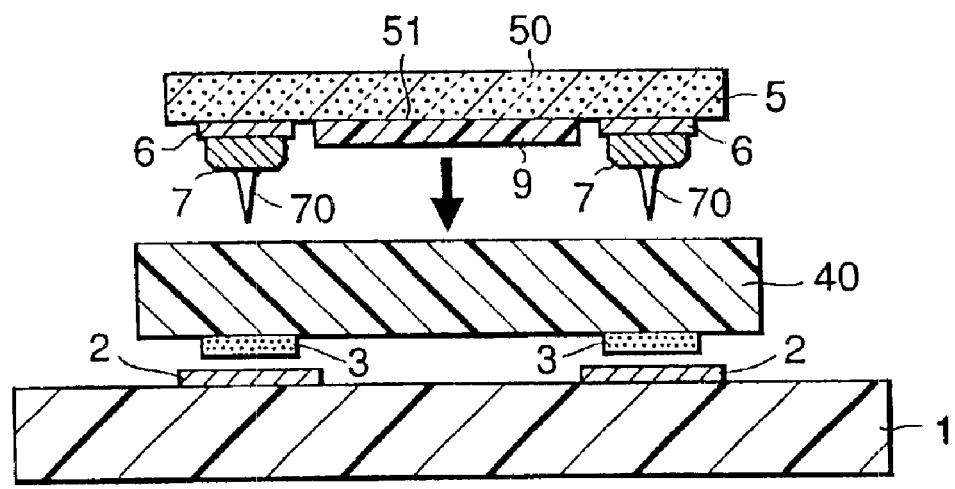
FIG. 7A shows an arrangement of a resin film for a circuit substrate, the circuit substrate, and a semiconductor device during a production process according to an embodiment of the invention.
Figure 7B:
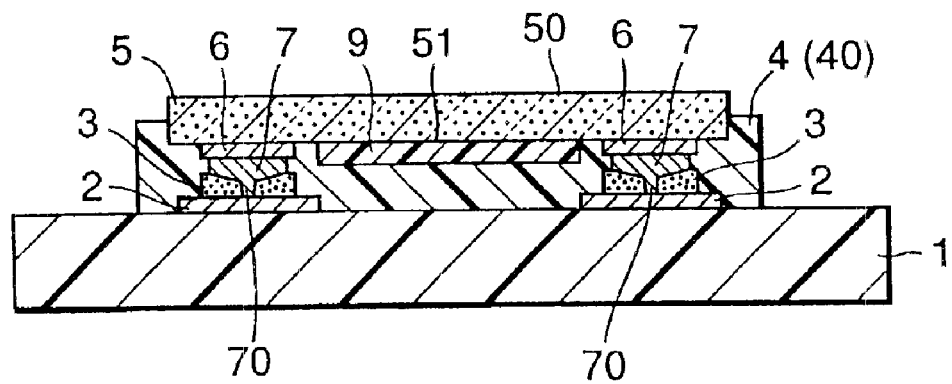
FIG. 7B shows a package structure assembled with use of the circuit substrate and the resin film of FIG. 7A, in a schematic cross-sectional view.

FIGS. 7A and 7B show another example of assembly using elastomer layer 9. In FIG. 7A, the elastomer layer 9 has previously been attached or bonded to semiconductor device 5. In FIG. 7B, by pressing the semiconductor device 5 toward the circuit substrate in the same manner as shown in FIG. 6C, bump electrodes 7 of the semiconductor device 5 are pierced into resin film 40, thereby reaching conductive adhesive layers 3, and further the resin film 40 presses the elastomer the semiconductor device 5 and integrates the semiconductor device 5 with the circuit substrate.

In a package structure of a third embodiment of the invention, a space between a circuit substrate and a semiconductor device may be filled with a liquid sealing resin together with a resin film. In a method of producing such a circuit substrate, such liquid sealing resin may be used instead of the resin film, or with the resin film by being applied to the resin film.

The liquid sealing resin may be porous. Existence of air bubbles in the sealing resin provides an advantageous structure in that a semiconductor device does not reduce much in a high-frequency property apparently because a dielectric constant of air is lower than that of the resin. Such a sealing resin may contain foaming components which generate air bubbles when resin components react to be cured. After curing, the air bubbles generated in the liquid resin remain as pores such that the sealing resin becomes porous. An amount of the air bubbles can be changed, for example, by controlling quantities of a reactive diluent and the like.

Figure 8A:
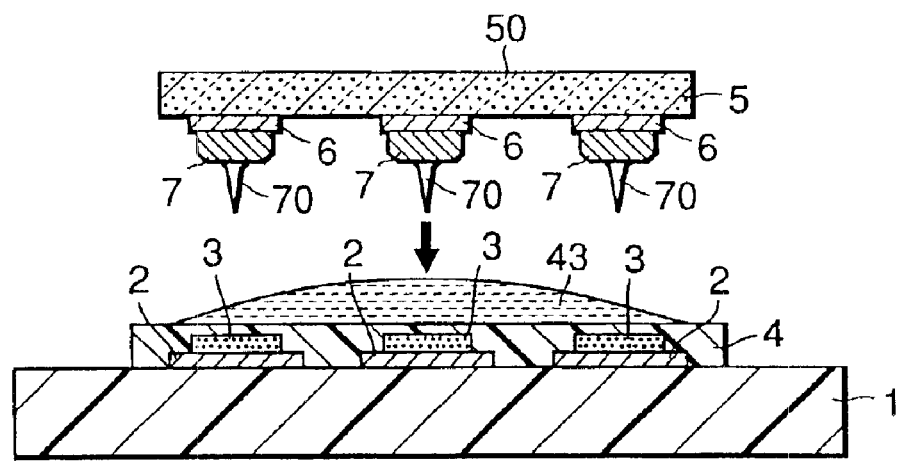
FIG. 8A shows an arrangement of a circuit substrate and a semiconductor device during a production process in accordance with an embodiment of the invention.
Figure 8B:
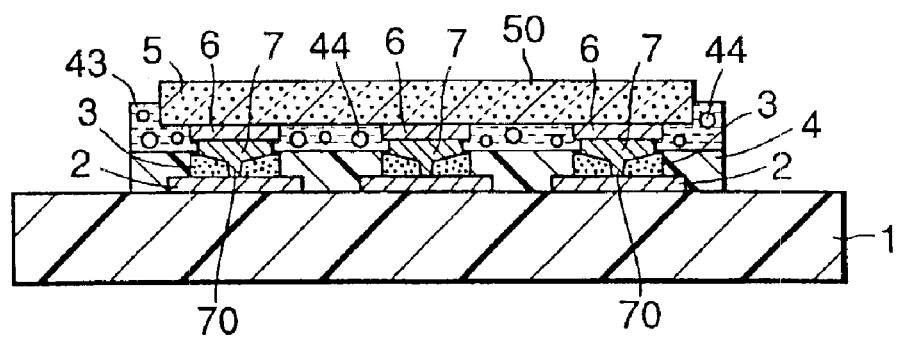
FIG. 8B shows a package structure assembled with use of the circuit substrate of FIG. 8A, in a schematic cross-sectional view.

When using a liquid resin, as shown in FIG. 8A, a liquid sealing resin is coated or dripped onto resin film 4 of circuit substrate. A semiconductor device 5 is pressed toward the circuit substrate. Bump electrodes 7 then are pierced into the resin film 4 to reach conductive adhesive layers 3 and to make electrical connections with terminal electrodes 2, thereby contacting the liquid sealing resin residing on the resin film 4. And, the liquid sealing resin is filled into a space between the circuit substrate and the semiconductor device 5 to bond both the substrate and the device together after being cured. FIG. 8B shows a package structure assembled in such a manner. The package structure shown in FIG. 8B exhibits an example in which the liquid sealing resin is a foaming resin which contains co-existing air bubbles 44.

Figure 9A:
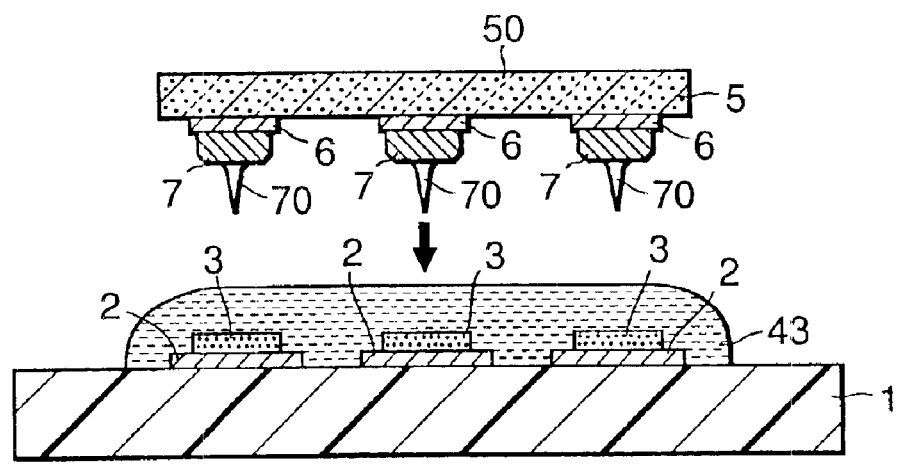
FIG. 9A shows an arrangement of a circuit substrate and a semiconductor device during a production process in accordance with an embodiment of the invention.
Figure 9B:
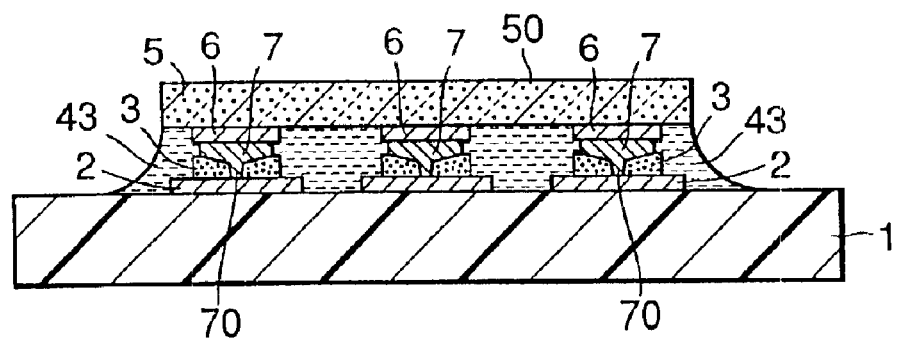
FIG. 9B shows a package structure that has been assembled with use of the circuit substrate of FIG. 9A, in a schematic cross-sectional view.

FIGS. 9A and 9B show an example in which terminal electrodes 2 on a main body 1 of a circuit substrate are covered only with a liquid sealing resin, i.e. without using a resin film. In FIGS. 9A and 9B, bump electrodes 7 on terminal electrodes (pads) of a semiconductor device 5 are connected to conductive adhesive on the terminal electrodes 2 of the circuit substrate, and the sealing resin is filled into a space between the semiconductor device 5 and the circuit substrate, which are thereby sealed.

Figure 10:
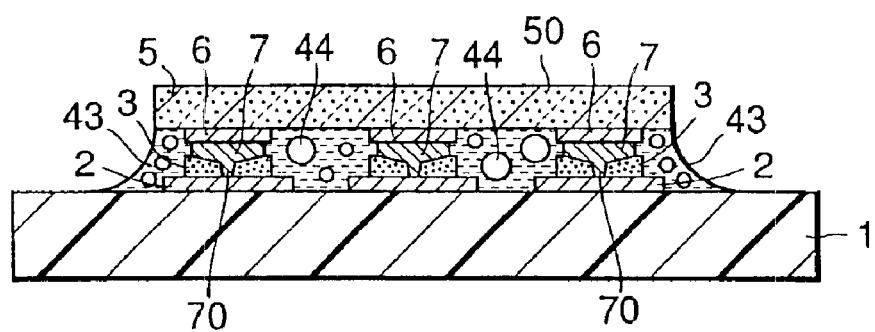
FIG. 10 is a schematic cross-sectional view of a package structure in accordance with an embodiment of the invention.

FIG. 10 shows an example where air bubbles 44 are made to remain in a sealing resin filling a space between a semiconductor device 5 and a circuit substrate so that the resin is made porous. A package structure having such air bubbles 44 prevents a high-frequency property of the semiconductor device 5 from being reduced. The sealing resin contains components which are foamed when cured.

Embodiments:

[Embodiment 1]

Figure 11:
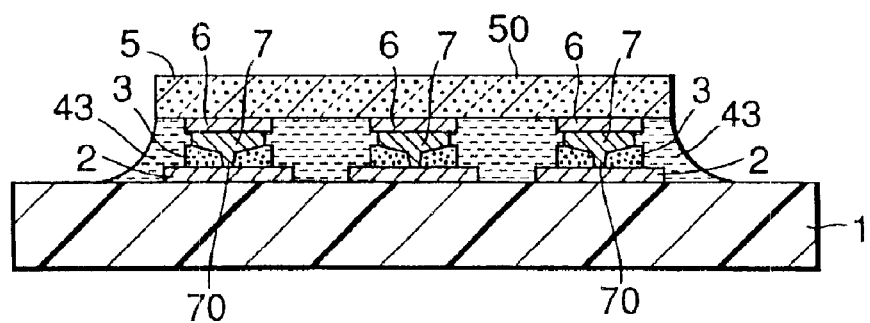
FIG. 11 is a schematic cross-sectional view of a package structure used in an embodiment of the invention.

FIG. 11 shows a schematic section of a package structure for a semiconductor device 5 used in a test that will be described below, i.e., a structure in which bump electrodes of the semiconductor device 5 are mounted on input/output terminal electrodes of a circuit substrate, with junction layers between, and which structure is reinforced with a sealing resin.

In Embodiment 1, Au bumps formed as the bump electrodes by performing a wire bonding method were mounted on the input/output terminal electrodes of the circuit substrate through conductive adhesive as the junction layers, and sealing with an epoxy sealing resin was executed.

In conventional example 1, Ni—Au electroless plated bumps were used as bump electrodes, solder was used as junction layers, and an ultraviolet curing epoxy resin was used as a sealing resin.

In each of Embodiment 1 and conventional example 1, a package structure for an n-channel MOS transistor was produced, and deterioration of the transistor was examined by a change in threshold voltage.

In results of a test, the n-channel MOS transistor of Embodiment 1 exhibited a change in threshold voltage of not greater than 0.7% with respect to a mounting load of 1 g per bump.

In conventional example 1 employing a conventional soldering method, by contrast, a threshold voltage of the n-channel MOS transistor changed by approximately 10% in comparison with that of an initial stage, after mounting with a mounting load of 10 g per bump.

Other package structures for SRAM according to the embodiment of the invention were produced in the same manner under mounting loads of 1 g and 20 g per bump, and achieved good connections after mounting, with no bit error (0/228) occurring due to a mounting operation.

In consideration of these results, it is found that, in the soldering method of conventional example 1, the junction layers have no component that is capable of relaxing a shrinkage stress which acts when the sealing resin is cured so that this stress acts directly on a semiconductor device and changes its threshold voltages. To the contrary, in the embodiment of the invention, soft conductive adhesive as junction layers can relax a curing shrinkage stress caused by the sealing resin, and therefore no stress acts on a semiconductor substrate of the semiconductor device, so that a satisfactory result can be obtained. A result of stress analysis also indicates that a package structure using conductive adhesive layers 3 can hardly produce stress therein. Therefore, it should be understood that conductive resin adhesive is an effective component for stress relaxation.

Figure 16A:
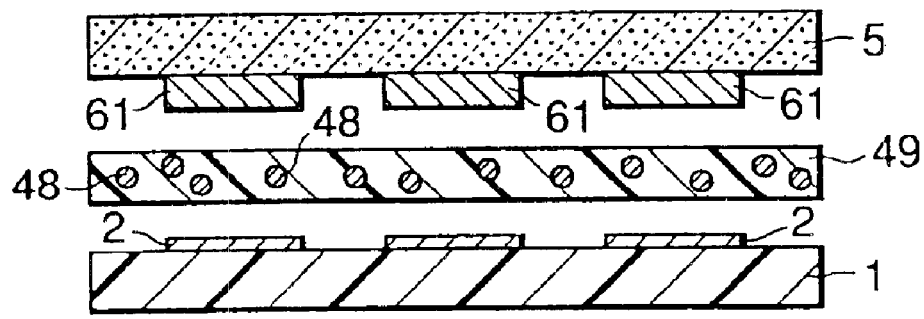
FIG. 16A shows an arrangement of a circuit substrate and a semiconductor device during mounting with use of a conventional anisotropic conductive film.
Figure 16B:
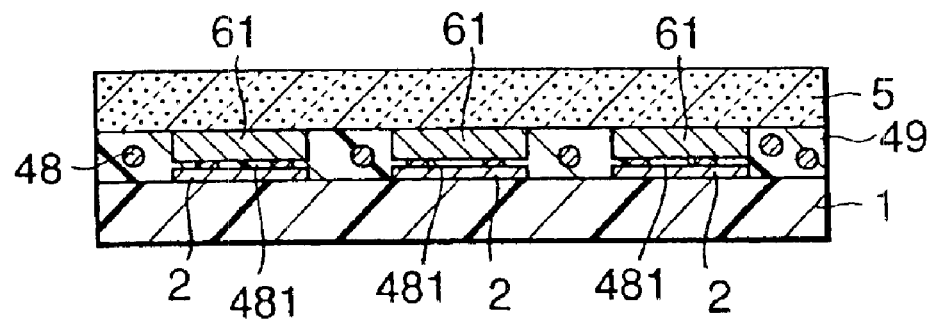
FIG. 16B shows a package structure that has been assembled as shown in FIG. 16A, in a schematic cross-sectional view.
Figure 17A:
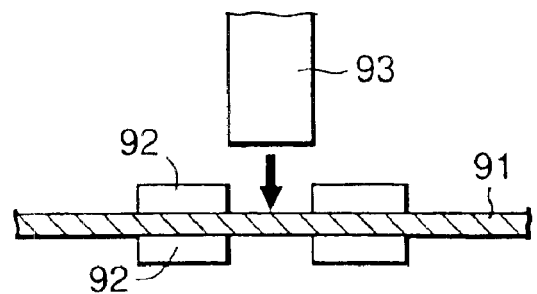
FIGS. 17A to 17D are schematic cross-sectional views showing a method of mounting a semiconductor device in accordance with prior art.
Figure 17B:
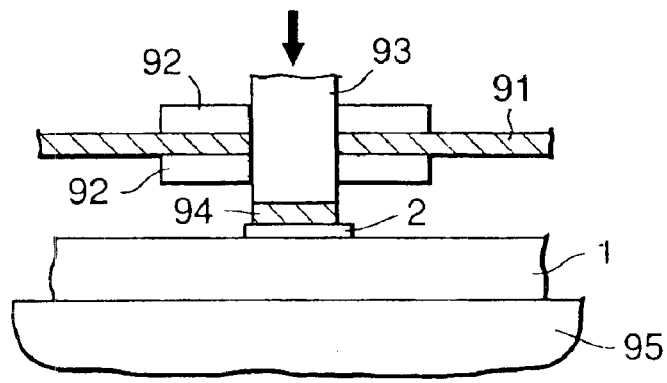
Figure 17C:
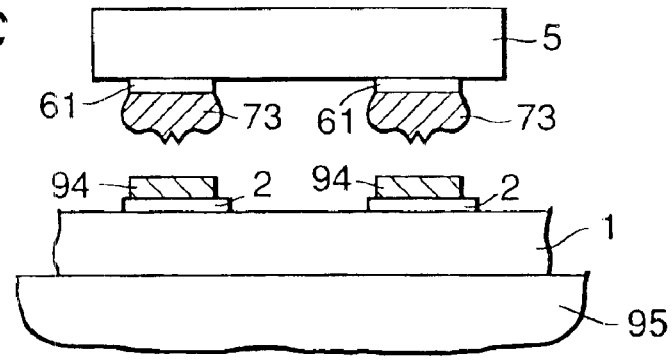
Figure 17D:
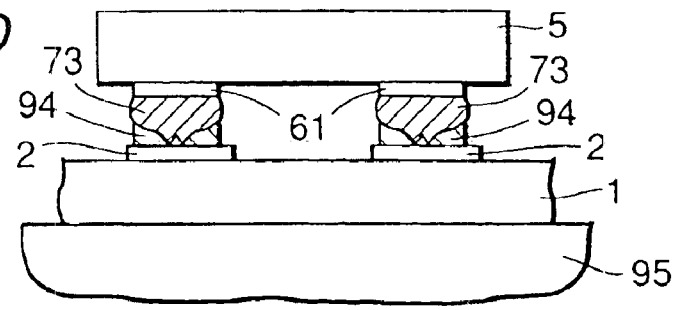

As a conventional example, tests of packaging a semiconductor device were conducted using a conventional anisotropic conductive film 49 shown schematically in FIG. 16A. Herein, bump electrodes of a semiconductor device were Au bumps formed with use of a wire bonding method, and there were used two types of circuit substrates, i.e., one having a ceramic main body and one having a glass-epoxy main body (a glass-fiber-reinforced epoxy main body, hereinafter the same) (FR4). The anisotropic conductive film had a thickness of 70 μm and contained Ni filler with a diameter of 5 μm. Packaging tests were conducted in which a mounting load between the bump electrodes of the semiconductor device and each of the circuit substrates was varied within a range from 10 to 80 g per bump electrode.

Figure 12A:
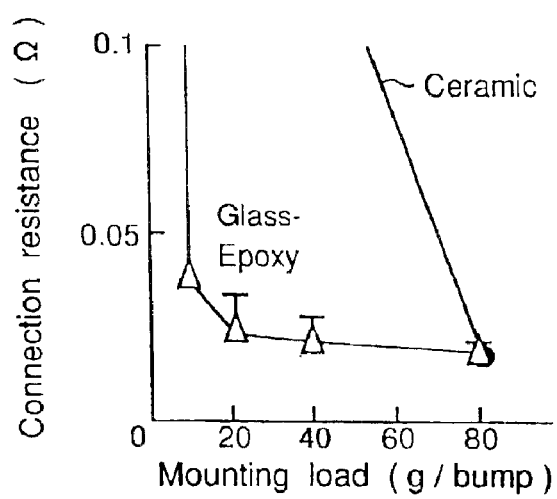
FIG. 12A is a graph showing relationships between mounting load and connection resistance in an embodiment of the invention.

FIG. 12A shows relationships between initial connection resistances per bump, after mounting, and bump loads. The connection resistances include electrical resistances of a terminal electrode of the circuit substrate and the Au bump of the semiconductor device, and an electrical resistance of the anisotropic conductive film. As for the circuit substrate having the ceramic main body, an initial connection was not obtained unless a mounting load of not less than 80 g per bump was achieved. As for the circuit substrate having the glass epoxy main body, resistance was found to be unstable unless an initial load of not less than 40 g per bump was applied.

Figure 12B:
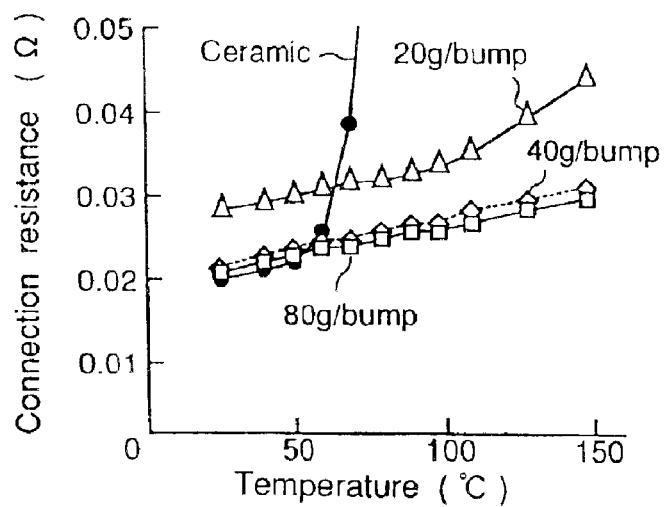
FIG. 12B is a graph showing changes in connection resistance with respect to temperature in the embodiment corresponding to FIG. 12A.
Figure 12C:
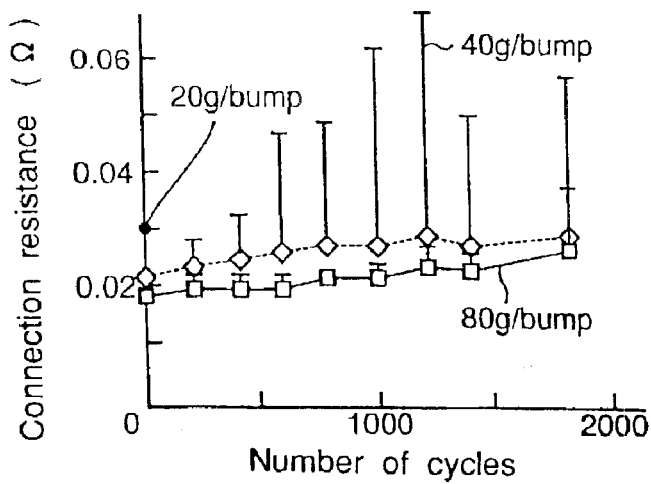
FIG. 12C is a graph showing relationships between heating-cooling cycle and stability of connection resistance in the embodiment corresponding to FIG. 12A.

FIG. 12B shows a change in resistance with respect to temperature for each sample, and a resistance change for the circuit substrate having the glass epoxy main body (FR4) was found to be stable with mounting loads of not less than 40 g per bump. Results of a heat shock test (a heat cycle in liquid phase is from −55 to 125° C.) shown in FIG. 12C, however, were unstable with a mounting load of 40 g per bump and stable with a mounting load of 80 g per bump.

FIGS. 13A to 13E are a series of photomicrographs obtained by microscopic observation in the vicinity of an electrode in a cross section of a package structure, in which loads for bonding varied from 5 to 40 g per bump, using a circuit substrate having a glass-epoxy main body (FR4). In each of these photographs, a pad electrode fixed to the main body of the circuit substrate is shown on a lower side, and a bump electrode on a side of a semiconductor chip is shown on an upper side. These photographs indicate that deformation of the bump electrode was caused with mounting loads on the order of at least 15 g per bump.

FIG. 13F shows a photomicrograph of a cross section in a case of using a circuit substrate having a ceramic main body. This substrate had rigidity, and input/output terminal electrodes were not deformed even with a mounting load of 80 g per bump, but unstable initial connection might develop faulty connection under a temperature characteristic of FIG. 12B.

Embodiment 2

Packaging tests were conducted with use of a circuit substrate of the invention. A circuit substrate having a glass-epoxy main body (FR4) was used, and the package structure shown in FIGS. 2A and 2B was tested. An epoxy resin film having a thickness of 50 μm was attached to a surface of the main body of the circuit substrate, including top surfaces of input/output terminal electrodes.

As bump electrodes of a semiconductor device, Au bumps with a size of its pointed head being 20 square μm were formed according to a wire bonding method. In a mounting structure, semiconductor device 5 had the bump electrodes on a chip pressed against and connected to the input/output terminal electrodes of the circuit substrate having the resin film previously bonded to the main body thereof, and the structure was reinforced by sealing resin filled into a space between the resin film and the chip. Tests were conducted with a variation of loads for pressing the bump electrodes of the semiconductor device to the input/output terminal electrodes of the circuit substrate.

A package structure obtained was tested regarding initial connection performance with respect to the mounting loads per bump, and regarding connection performance after reflowing and, in addition, tests were made when the structure was repeatedly heated five times at 270° C.

Table 1 shows these test results. Samples having this package structure exhibited stable and good electrical and mechanical connection performance over all connections between the bump electrodes of the semiconductor device and the terminal electrodes, with loads of not lower than 20 g per bump being applied at a time of mounting.

TABLE 1

| Mounting load (g/bump) | 5 | 10 | 20 | 40 |
|---|---|---|---|---|
| Connectability after mounting | Good | Good | Good | Good |
| Connectability after reflow (240° C.) | Failure | Good | Good | Good |
| Solder heat test (five times at 270° C.) | Failure | Failure | Good | Good |

Figure 14A:
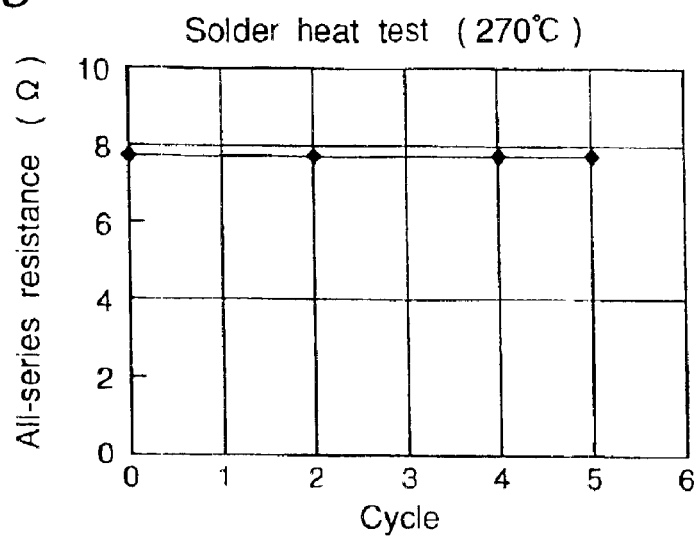
FIG. 14A shows relationships between all-series resistance of all connection portions in an embodiment of the invention and repeated heat cycles in a solder heat test.

FIG. 14A shows a change in resistance of junction portions at each stage of solder heat tests. In the solder heat tests, samples with mounting loads of not lower than 20 g per bump show no change in junction resistance, even when heating is repeated for five cycles at 270° C.

Figure 14B:
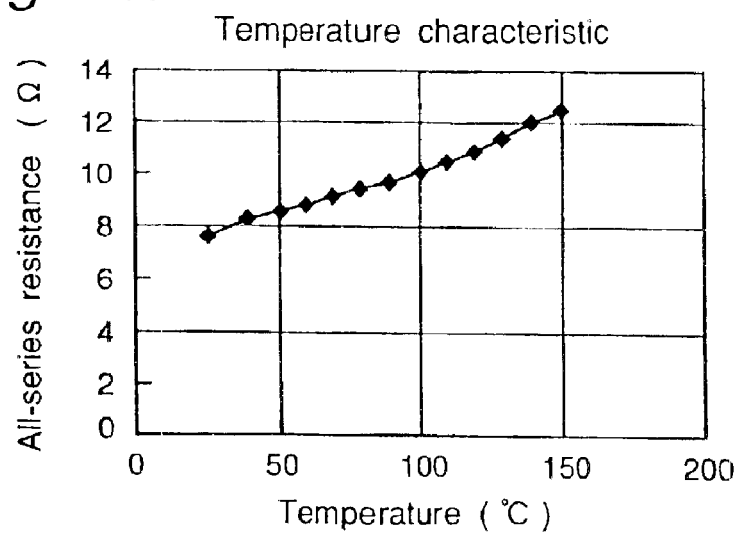
FIG. 14B shows temperature dependency of all-series resistance in a test on a connection part in the embodiment of the invention corresponding to FIG. 14A.

FIG. 14B shoes stable connection performance with regard to temperature characteristics of junction resistance, and it was found that a satisfactory result was obtained.

Figure 14C:
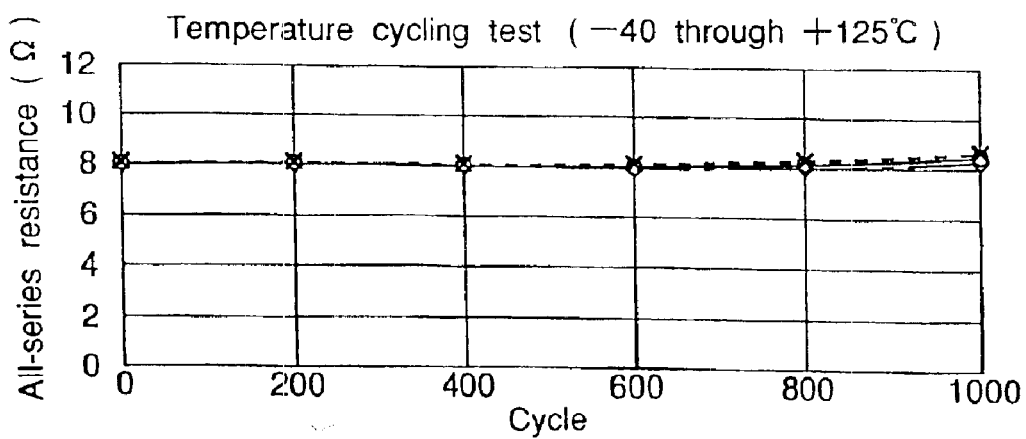
FIG. 14C shows relationships between number of heating-cooling cycles in a temperature cycling test and connection resistance in the connection part in the embodiment of the invention corresponding to FIG. 14A.

FIG. 14C shows a result of a repetition test between heating (+125° C.) and cooling (−40° C.) (temperature cycling test) run on eight samples having the above package structure (produced with a mounting load of 20 g per bump). There is little change in all series connection resistance of all junction portions even after 1000 cycles, and there is no substantial difference in resistance change among the eight samples.

Figure 15:
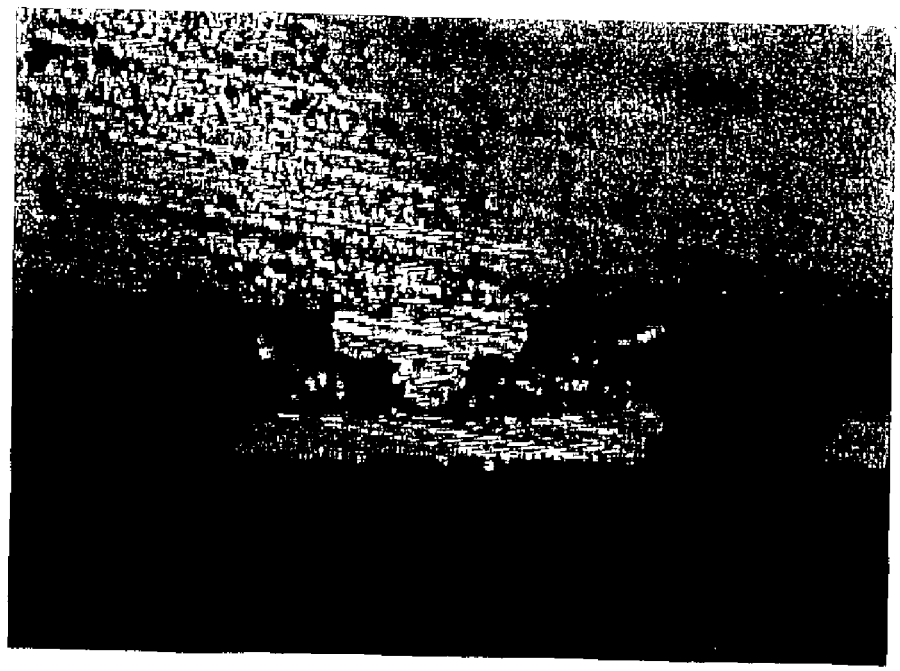
FIG. 15 is a metallographical photograph of a metal section of a junction of a package structure in which mounting has been executed with use of conductive adhesive and a resin film of the invention.

FIG. 15 is a photograph showing a cross section of a junction portion including a bump electrode and a pad electrode in a package structure of an embodiment produced with a mounting load of 20 g per bump, and shows that input/output terminal electrodes of a substrate thereof are not deformed under this load, which makes packaging with a low stress possible. It is found from the above test results that a stable connection can be obtained with lower loads than in a packaging method using conventional anisotropic conductive film.

INDUSTRIAL APPLICABILITY

The circuit substrate of the invention, and the method of producing the same, can be utilized for producing and using substrates which are provided for an ele ctrical industry, particularly for a semiconductor manufacturing industry. A method of producing a package structure of a semiconductor device can be widely used for production and use of semiconductor package structures in the electrical industry, particularly in the semiconductor manufacturing industry.

What is claimed is:

1. A circuit substrate to be used for packaging a semiconductor device, comprising:
   a main body having input/output terminal electrodes on a surface thereof, with each of said input/output terminal electrodes having
      (i) a first surface that opposes said surface of said main body, and
      (ii) a second surface that faces in a direction opposite to that in which said first surface faces; and
   a resin film having conductive adhesive portions, composed of conductive adhesive including thermoplastic resins or thermosetting resins, on a surface of said resin film, each of said conductive adhesive portions having
      (i) a first surface that opposes said surface of said resin film, and
      (ii) a second surface that faces in a direction opposite to that in which said first surface faces,
   wherein the circuit substrate is formed by bonding said resin film onto said main body such that said conductive adhesive portions are positioned on said input/output terminal electrodes, respectively, and said resin film covers said surface of said main body and said input/output terminal electrodes along with said conductive adhesive portions.

2. The circuit substrate according to claim 1, wherein said resin film contacts said second surface of said conductive adhesive portions.

3. The circuit substrate according to claim 2, wherein said resin film contacts said second surface of said input/output terminal electrodes.

4. The circuit substrate according to claim 1, wherein
   each of said input/output terminal electrodes has a top side, a bottom side, and a lateral side interconnecting said top and bottom sides,
   each of said conductive adhesive portions has a top side, a bottom side, and a lateral side interconnecting said top and bottom sides,
   said resin film completely covers each of said input/output terminal electrodes on two of said top side, said bottom side and said lateral side thereof, and
   said resin film completely covers each of said conductive adhesive portions on two of said top side, said bottom side and said lateral side thereof.

5. A circuit substrate to have mounted thereon a semiconductor device, comprising:
   a main body having input/output terminal electrodes on a surface thereof; and a resin film having on one surface thereof conductive adhesive portions, and having on an opposite surface thereof an elastomer layer, said resin film being initially separate from said main body, said conductive adhesive portions being composed of conductive adhesive including thermoplastic resins or thermosetting resins, wherein on the circuit substrate, a semiconductor device is to be mounted by
   (i) superposing said resin film and said main body such that said conductive adhesive portions are positioned on corresponding ones of said input/output terminal electrodes, and
   (ii) pressing bump electrodes of the semiconductor device into said resin film so as to reach said conductive adhesive portions and be connected to said corresponding ones of said input/output terminal electrodes, wherein said elastomer layer is positioned on said opposite surface so as to correspond with at least part of a surface of the semiconductor device on which a functional part of the semiconductor device resides, when the semiconductor device is mounted on the circuit substrate.

6. The circuit substrate according to claim 5, wherein said resin film becomes attached to said main body during the pressing of the bump electrodes of the semiconductor device into said resin film.

7. The circuit substrate according to claim 6, wherein said elastomer layer is softer and more elastic than said resin film.

8. The circuit substrate according to claim 5, wherein said elastomer layer is softer and more elastic than said resin film.

9. A package structure comprising:
   a circuit substrate having input/output terminal electrodes, and conductive adhesive, including thermoplastic resins or thermosetting resins, on each of said input/output terminal electrodes;
   a semiconductor device having bump electrodes that are electrically and mechanically connected to said conductive adhesive and to said input/output terminal electrodes, said bump electrodes being in contact with said input/output terminal electrodes; and
   a resin layer between said circuit substrate and said semiconductor device, said resin layer bonding and fixing said semiconductor device to said circuit substrate, wherein the package structure is formed by
   (i) superposing a resin film, having said conductive adhesive portions, and a main body, having said input/output terminal electrodes, such that said conductive adhesive portions are positioned on corresponding ones of said input/output terminal electrodes, and
   (ii) pressing said bump electrodes of said semiconductor device into said resin film so as to reach said conductive adhesive portions and contact said corresponding ones of said input/output terminal electrodes.

10. The package structure according to claim 9, further comprising:
   an elastomer layer interposed between said resin layer and a functional part of said semiconductor device, said elastomer layer being softer and more elastic than said resin layer.

11. The package structure according to claim 10, wherein said resin layer comprises said resin film or a sealing resin.

12. The package structure according to claim 11, wherein said bump electrodes pass through said resin film or sealing resin.

13. The package structure according to claim 10, wherein said bump electrodes pass through said resin film or sealing resin.

14. The package structure according to claim 9, wherein said resin layer comprises said resin film or a sealing resin.

15. The package structure according to claim 14, wherein said bump electrodes pass through said resin film or sealing resin.

16. The package structure according to claim 9, wherein said bump electrodes pass through said resin layer.

* * * * *